United States Patent [19]

Letterman, Jr.

[11] Patent Number: 5,309,027

[45] Date of Patent: May 3, 1994

[54] ENCAPSULATED SEMICONDUCTOR PACKAGE HAVING PROTECTANT CIRCULAR INSULATORS

[75] Inventor: James P. Letterman, Jr., Phoenix, Ariz.

[73] Assignee: Motorola, Inc., Schaumburg, Ill.

[21] Appl. No.: 898,641

[22] Filed: Jun. 15, 1992

[51] Int. Cl.$^5$ .................... H01L 23/48; H01L 23/28; H01L 39/02; H01L 23/02

[52] U.S. Cl. .................................. 257/796; 257/666; 257/668; 257/675; 257/719; 257/787; 257/792

[58] Field of Search ............... 257/666, 668, 674, 675, 257/712, 719, 787, 796, 798, 792

[56] References Cited

U.S. PATENT DOCUMENTS 4,916,518 4/1990 Yoshimura .......................... 257/796
5,038,200 8/1991 Hosomi et al. ..................... 257/796

OTHER PUBLICATIONS

Data Sheet, "Tamac 4" Mitsubishi Shindo Co. Limited Tokyo Japan.
Data Sheet, "P-221 1 Mil Kapton Film Circuit Board Masking Tape", Permacel Company, New Brunswick, N.J.

Primary Examiner—Jerome Jackson
Assistant Examiner—Carl Whitehead, Jr.
Attorney, Agent, or Firm—Robert F. Hightower; Joe E. Barbee

[57] ABSTRACT

The present invention includes a semiconductor package (20) that has a leadframe (10). An insulator (13) is mounted on a surface of a flag (11) of the leadframe (10) to insulate a portion of the leadframe (10) from the external environment. A semiconductor die (16) is also mounted on the flag (11), spaced away from the insulator (13). A portion of the leadframe (10), the semiconductor die (16), and a portion of the insulator (13) are encapsulated by a body (21) of the package (20). The body (21) also has an alignment hole (23) that extends from a surface of the body to the insulator (13), and exposes a portion of a surface of the insulator (13). In addition, the body (21) overlaps the insulator (13) and forms a seal to the insulator (13) protecting the leadframe (10) from the external environment.

14 Claims, 2 Drawing Sheets

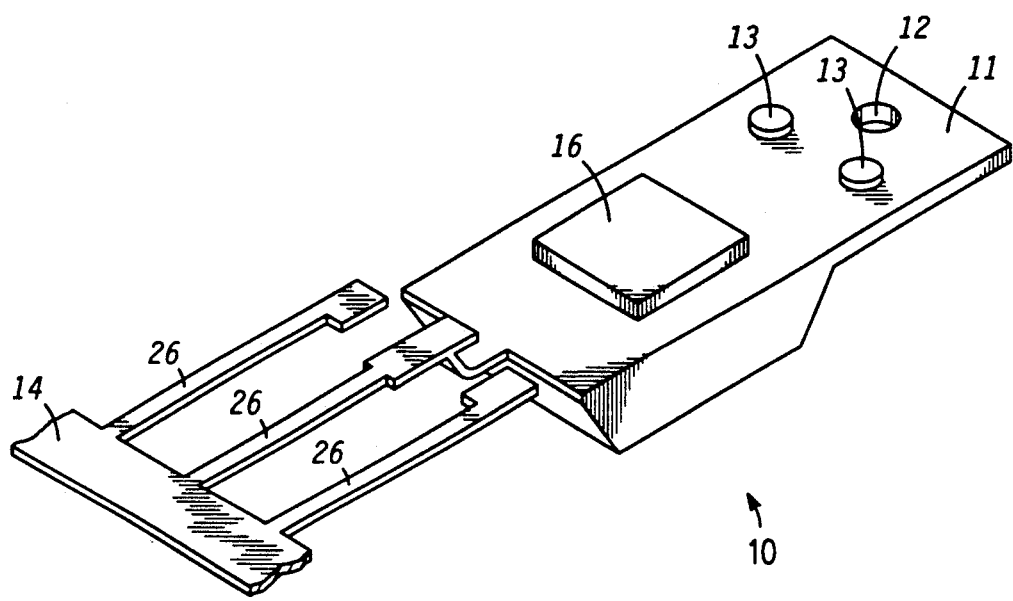
FIG. 1
FIG. 2
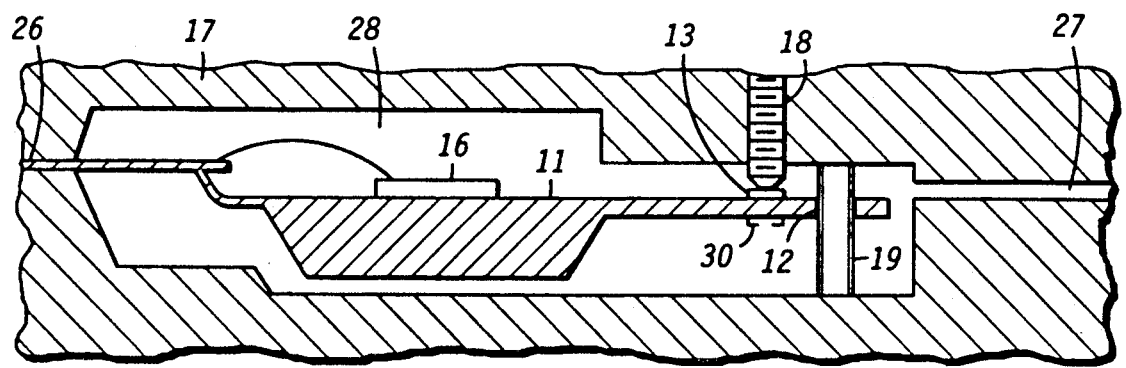

ENCAPSULATED SEMICONDUCTOR PACKAGE HAVING PROTECTANT CIRCULAR INSULATORS

BACKGROUND OF THE INVENTION

The present invention relates, in general, to semiconductor packages, and more particularly, to a novel semiconductor package having high breakdown voltage.

In the past, the semiconductor industry has provided many different styles and configurations of semiconductor packages. Packages used for high power dissipation semiconductor devices often have leads extending only from one side of the package. These leads typically are extensions of a leadframe that extends into the package's body. During the process of molding the body around portions of the leadframe, it is often necessary to utilize alignment pins to hold internal portions of the leadframe in place. These alignment pins extend into the molding cavity during molding operations. When the alignment pins are removed, holes are left in the package body thereby exposing portions of the leadframe to the external environment.

After the encapsulation procedure is complete, foreign material such as mold release compounds are cleaned from the exposed leadframe portions, and the holes are filled with an epoxy or silicone material. The cleaning operation increases the package's cost and typically requires the use of environmentally detrimental chemicals.

Due to thermal expansion differences, the epoxy fill material eventually cracks thereby exposing the leadframe to the environment, and reducing the package's breakdown voltage below the desired value of greater than 1500 volts. Although silicones last longer than epoxy, silicones also fail thereby reducing the package's reliability and breakdown voltage.

In addition, the silicon and epoxy materials used during the fill operation have a limited shelf life. Consequently, the material storage time must be closely monitored thereby further increasing the package's cost.

Accordingly, it is desirable to have a semiconductor package that provides a breakdown voltage in excess of 1500 volts, that does not use epoxy or silicone to fill openings in the package's body, and that seals holes with materials having a long shelf life.

SUMMARY OF THE INVENTION

Briefly stated, the present invention includes a semiconductor package that has a leadframe. An insulator is mounted on a surface of a flag of the leadframe. A semiconductor die is also mounted on the flag, spaced from the insulator. A portion of the leadframe, the semiconductor die, and a portion of the insulator are encapsulated by a body of the package. The body also has an alignment hole that extends from a surface of the body to the insulator, and exposes a portion of a surface of the insulator. In addition, the body overlaps the insulator and forms a seal to the insulator thereby protecting the leadframe from the external environment.

BRIEF DESCRIPTION OF THE DRAWINGS

FIG. 1 illustrates a perspective view of a leadframe in accordance with the present invention;

FIG. 2 illustrates the leadframe of FIG. 1 during the step of molding a package body in accordance with the present invention.

DETAILED DESCRIPTION OF THE DRAWINGS

Figure 3:
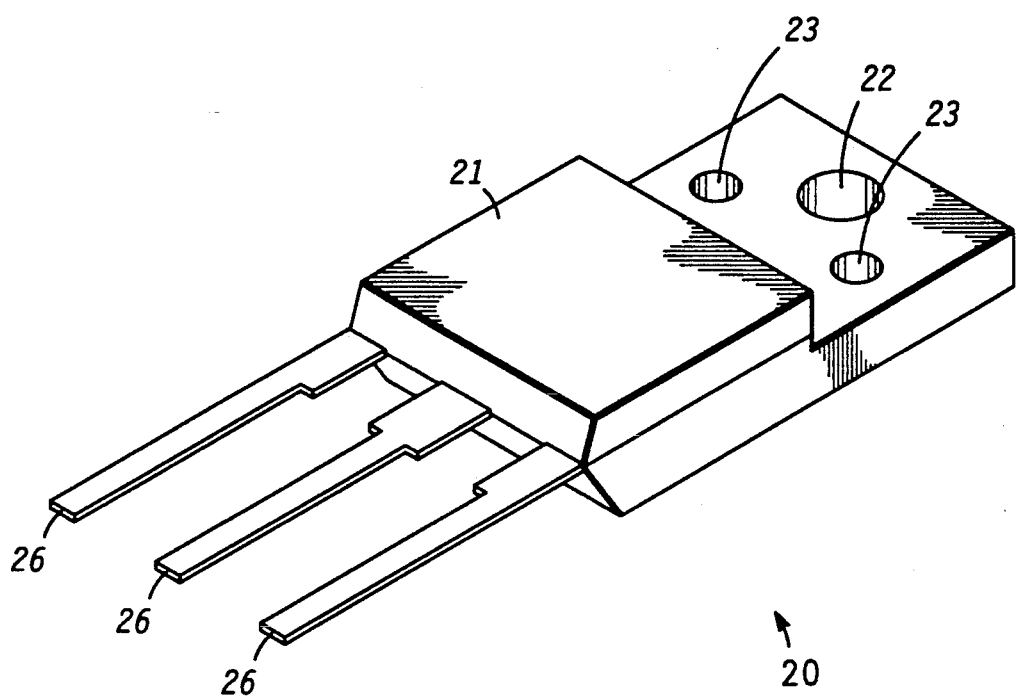
FIG. 3 illustrates a semiconductor package that includes the leadframe of FIG. 1 in accordance with the present invention.

FIG. 1 illustrates a leadframe 10 that will subsequently become part of a semiconductor package that has a high breakdown voltage. Leadframe 10 can be formed from a variety of leadframe materials that are well known to those skilled in the art. In the preferred embodiment, leadframe 10 is formed from a copper alloy that includes, by weight, at least approximately 99.6% copper, 0.05%–0.15% iron, and 0.015%–0.05% phosphorus. One example of such an alloy is known as TAMAC 4 manufactured by Mitsubishi Shindoh Company Limited of Tokyo, Japan. Leadframe 10 includes a flag 11 and a plurality of leads 26. One of the plurality of leads 26 is electrically connected to flag 11 while the remaining plurality of leads 26 is held in place by a temporary support strip 14. After the package has been completed, temporary support strip 14 will be removed. An opening 12 through flag 11 facilitates subsequent formation of a mounting hole through the completed package as will be seen hereinafter. A plurality of insulators 13 are positioned on flag 11 at positions that will be contacted by alignment pins during a subsequent molding operation as will be seen hereinafter. The material used for insulators 13 must electrically insulate the covered portion of flag 11 and must bond to the encapsulating material used to form the semiconductor package's body. Insulators 13 could be formed by screen printing an insulating polymeric material such as polyimide, by spraying an insulating film such as a plastic resin, or by applying a self-adhesive insulating film. In the preferred embodiment, insulators 13 are circular sections of—"KAPTON, a registered trademark of E. I. Du Pont De Memours Corp. of Wilmington, Del.,— that have a diameter of approximately 1.2 microns. In this preferred embodiment, one surface of the "KAPTON" is coated with a pressure sensitive silicone adhesive that is used to adhere the circular "KAPTON" sections to flag 11. One example of such a "KAPTON" film is known as P-221 "Circuit Board Masking Tape" manufactured by Permacel of New Brunswick, N.J. Self adhesive "KAPTON" has a very long shelf life and is easy to apply to leadframe 10. The thickness of insulators 13 should be sufficient to provide a desired breakdown voltage. In the preferred embodiment, insulators 13 are between approximately 0.02 and 0.05 millimeters thick in order to provide a breakdown voltage in excess of approximately 1500 volts. Typically, insulators 13 are applied to flag 11 before attaching a semiconductor die 16 to leadframe 10, and before subsequent wire bonding of die 16 to leads 26. This sequence of operations results in unencumbered mounting of insulators 13.

FIG. 2 illustrates a stage in molding a package body around leadframe 10 of FIG. 1. Portions of FIG. 2 that are the same as FIG. 1 have the same reference numerals. Leadframe 10 is inserted into a cavity 28 of a mold 17. An encapsulating material enters cavity 28 through a chase or runner 27. Since the encapsulating material is under pressure, a plurality of alignment pins 18 are used to maintain flag 11 in a stationary position during the encapsulating operation. Although FIG. 2 illustrates one pin 18, a second alignment pin is hidden from view. Also, additional alignment pins could be employed to grasp leadframe 10 from both the top and bottom instead of just the top as shown in FIG. 2. When additional alignment pins are employed, additional insulators 13 are placed on the bottom of leadframe 11, as shown by dashed lines 30. In order to ensure that leadframe 10 is completely encapsulated, it is important that pins 18 have a smaller diameter than insulators 13 thereby allowing the encapsulating material to overlap the periphery of insulators 13. This overlap allows the encapsulant to adhere to insulators 13 and form an environmental seal that completely seals leadframe 10 from the external environment.

A mounting pin 19 extends through opening 12 to prevent the encapsulant from totally closing opening 12. Mounting pin 19 has a smaller diameter than opening 12 thereby allowing the encapsulant to surround and electrically insulate opening 12.

FIG. 3 illustrates a high breakdown voltage semiconductor package 20 that is formed to include leadframe 10 of FIG. 1. Portions of FIG. 3 that are the same as FIG. 1 have the same reference numerals. Package 20 includes a body 21 having plurality of leads 26 extending from one edge thereof. An electrically isolated mounting hole 22 that extends through package 20 is created by opening 12 and pin 19 of FIG. 2. A plurality of alignment holes 23, resulting from alignment pins 18 of FIG. 2, extend from the surface of body 21 through a portion of body 21 and expose a portion of insulators 13. The diameter of alignment holes 23 is smaller than the diameter of insulators 13 thereby assisting in forming the environmental seal at the junction of holes 23 and insulators 13.

Insulators 13 not only seal package 20, but also increase the breakdown voltage of package 20. For example, a package formed without insulators 13 provides a maximum breakdown voltage of approximately 1,500 volts. Package 20 formed to include insulators 13 has a minimum breakdown voltage in excess of 3,000 volts. Consequently, insulators 13 at least double the breakdown voltage of package 20.

By now it should be appreciated that a novel package having high breakdown voltage has been provided. The insulators placed on the leadframe facilitate the formation of an environmental seal that improves the package's reliability and lifetime. The insulators also electrically isolate the leadframe thereby increasing the package's breakdown voltage. The insulators have a long shelf life and are easily applied. Consequently, the package's cost is low.

I claim:

1. An insulated semiconductor package comprising:
    a leadframe having a flag wherein the flag has a surface;
    a semiconductor die attached to the surface of the flag;
    an opening through the flag, the opening having a diameter;
    a plurality of circular insulators attached to the surface of the flag and positioned between the opening and the semiconductor die wherein the plurality of circular insulators are attached by an adhesive film, the plurality of the circular insulators having a diameter;
    a body encapsulating the leadframe;
    a mounting hole through the body wherein the mounting hole is concentric with the opening and has a diameter that is smaller than the diameter of the opening;
    an alignment hole extending from a surface of the body to one of the plurality of circular insulators, the alignment hole having a diameter that is smaller than the diameter of the plurality of circular insulators so that the body overlaps the one of the plurality of circular insulators and exposes a portion of the one of the plurality of circular insulators;
    an environmental seal at a junction of the body and the one of the plurality of circular insulators wherein the environmental seal seals the leadframe from an environment external to the body; and
    a plurality of leads extending from an edge of the body wherein the edge of the body is opposite an edge near the mounting hole.

2. The semiconductor package of claim 1 wherein the plurality of circular insulators are formed from polymide and have a thickness of approximately 0.02 to 0.05 millimeters.

3. The semiconductor package of claim 1 wherein the plurality of circular insulators have a diameter of approximately 1.2 microns.

4. The semiconductor package of claim 1 wherein the adhesive film includes an adhesive silicone film.

5. The semiconductor package of claim 1 wherein the leadframe is formed from a copper alloy.

6. A semiconductor package comprising:
    a leadframe having a flag wherein the flag has a surface;
    a lead extending from a first edge of the leadframe;
    a semiconductor die attached to the surface of the flag;
    an insulator attached to the surface of the flag;
    a body encapsulating the semiconductor die and a portion of the leadframe;
    an alignment hole extending from a surface of the body to the insulator wherein the alignment hole has a diameter that is smaller than a diameter of the insulator so that the body overlaps a first portion of the insulator while a second portion of the insulator is exposed; and
    an environmental seal formed by a junction of the body and the insulator wherein the environmental seal seals the leadframe from an environment external to the body.

7. The semiconductor package of claim 6 wherein the insulator attached to the surface of the flag includes the insulator that is positioned between the semiconductor die and a second edge of the leadframe wherein the second edge is opposite the first edge.

8. The semiconductor package of claim 6 wherein the insulator is an insulating film that is attached to the surface of the flag by an adhesive film that is on a surface of the insulating film.

9. The semiconductor package of claim 6 wherein the insulator has a thickness of approximately 0.02 to 0.05 millimeters.

10. The semiconductor package of claim 6 wherein the leadframe is formed from a copper alloy.

11. An encapsulated semiconductor package comprising:
    an alignment pin created opening in an encapsulating material of the package wherein the opening extends to a flag portion that is surrounded by the encapsulating material; and
    an insulating material on the flag portion wherein a first portion of the insulating material is exposed by the opening and a second portion of the insulating material is covered by the encapsulating material.

12. The semiconductor package of claim 11 wherein the insulating material includes a circular insulator attached to the flag.

13. The semiconductor package of claim 11 wherein the insulating material includes a first insulator attached to a first surface of the flag portion, and a second insulator attached to a second surface of the flag portion.

14. The semiconductor package of claim 11 wherein the insulating material has a thickness of approximately 0.02 to 0.05 millimeters.

* * * * *